(12) United States Patent
Haight et al.

(10) Patent No.: US 6,656,539 B1
(45) Date of Patent: Dec. 2, 2003

(54) METHOD AND APPARATUS FOR PERFORMING LASER CVD

(75) Inventors: Richard A. Haight, Mahopac, NY (US); Peter P. Longo, Hopewell Jct, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 09/711,269

(22) Filed: Nov. 13, 2000

(51) Int. Cl.$^7$ .............................. B05D 3/06; C23C 16/48
(52) U.S. Cl. ...................... 427/553; 427/554; 427/582; 427/584; 427/555
(58) Field of Search ................................ 427/553, 554, 427/555, 558, 581, 584, 586, 582

(56) References Cited

U.S. PATENT DOCUMENTS

| | | | |
|---|---|---|---|
| 4,340,617 A | | 7/1982 | Deutsch et al. |
| 4,451,503 A | * | 5/1984 | Blum et al. |
| 4,608,117 A | | 8/1986 | Ehrlich et al. |
| 4,615,904 A | | 10/1986 | Ehrlich et al. |
| 4,711,790 A | * | 12/1987 | Morishige ..................... 427/10 |
| 4,769,310 A | * | 9/1988 | Gugger et al. .............. 430/346 |
| 5,060,595 A | * | 10/1991 | Ziv et al. |
| 5,130,172 A | * | 7/1992 | Hicks et al. |
| 5,246,745 A | | 9/1993 | Baum et al. |
| 5,250,329 A | * | 10/1993 | Miracky ..................... 427/586 |
| 5,308,651 A | * | 5/1994 | Ohta et al. .................. 427/584 |
| 5,407,710 A | * | 4/1995 | Baum et al. ................. 427/555 |
| 5,686,206 A | * | 11/1997 | Baum et al. ................. 427/558 |
| 5,753,320 A | * | 5/1998 | Mikoshiba et al. ......... 427/584 |
| 6,090,507 A | | 7/2000 | Grenon et al. |
| 6,261,850 B1 | * | 7/2001 | Marsh ......................... 427/554 |
| 6,312,768 B1 | * | 11/2001 | Rode et al. .................. 427/554 |
| 6,319,566 B1 | * | 11/2001 | Polanyi et al. .............. 427/555 |
| 6,465,054 B2 | * | 10/2002 | Effenberger ................ 427/553 |
| 6,480,074 B1 | * | 11/2002 | Kaitila et al. ............... 427/586 |

OTHER PUBLICATIONS

R. Solanki et al, "Laser Photodepostion of Refractory Metals", App. Phys. Lett. 38(7) Apr. 1, 1981, pp. 572–574.
D.K. Flynn et al, "Deposition of Refractory Metal Films by Rare–Gas Halide Laser Photodissociation of Metal Carbonyls", J Appl. Phys. 59 (11), Jun. 1, 1986, pp. 3914–3917.
S.A. Trushin et al., "Femtosecond Dynamics and Vibrational Coherence in Gas–Phase Ultraviolet Photodecomposition of $CR(CO))_6$.", J. Phys. Chem. A, 1998, 102, pp. 4129–4137. No month.
R. Alexandrescu, "Laser–Stimulated Processes in Metal Carbonyls for Metal–Based Film Synthesis", Applied surface Science 106 (1996) pp. 28–37, No month.
H.H. Gilgen et al., "Direct Writing of Metal Conductors with Near –uv Light", Appl. Phys. B 42, 55–66 (1987), pp. 55–66, No month.

* cited by examiner

Primary Examiner—Marianne Padgett
(74) Attorney, Agent, or Firm—Casey P. August; Stephen Bongini; Fleit, Kain, Gibbons, Gutman, Bongini & Bianco P.L.

(57) ABSTRACT

An element is deposited by flowing a gas through a solid donor compound that includes the element, and over a substrate. The flow of gas deposits a film of a few monolayers of donor compound on the substrate. An optical radiation source (e.g., a femtosecond laser) which produces optical radiation at an instantaneous intensity sufficient to cause non linear or otherwise enhanced interaction between optical radiation photons and the donor compound is used to decompose the donor compound and deposit the metal on the substrate. After an initial deposit of the donor compound is produced, optical radiation can be absorbed and heat the substrate in the localized area of the deposit in order to accelerate the deposition process by thermally decomposing the donor compound.

28 Claims, 8 Drawing Sheets

METHOD AND APPARATUS FOR PERFORMING LASER CVD

FIELD OF THE INVENTION

This invention pertains to depositing metal using optical radiation assisted chemical vapor deposition. More particularly, this invention pertains to depositing metal for lithographic mask repair.

BACKGROUND OF THE INVENTION

Masks used in the semiconductor industry comprise a pattern deposited on a surface of a substrate. In performing lithography the mask is positioned at an object focal plane of a projection system and illuminated, so that the pattern is transferred to a photoresist born on a lithography work piece (e.g., a semiconductor wafer). In the case of deep ultraviolet lithography (as opposed to extreme ultraviolet lithography), a transmissive mask which selectively transmits light according to a pattern of opaque material born on its surface is used. The substrate generally used for transmissive semiconductor lithography masks is a deep UV grade of fused silica. The pattern born on the fused silica mask generally comprises Chromium. Such, chrome on Glass (COG) mask blanks are available commercially from Hoya, Inc. of Japan. A direct write e-beam exposure tool is used to expose a resist coated on the Chromium according to a predetermined pattern. The resist is then developed, and the predetermined pattern is transferred to the Chromium by etching.

Unfortunately, mask production is not a very high yield process. Because e-beam exposure is very time consuming, it is preferable to repair defective masks, rather than making new replacement masks. Mask defects can be placed in two categories: (1) undesired absence of pattern material, and (2) undesired presence of pattern material. In order to eliminated unwanted pattern material, laser ablation can be used. For example, U.S. Pat. No. 6,090,507 assigned in common with the present invention teaches a method of laser ablation using a high intensity femtosecond laser ablation tool. Using a femtosecond laser for ablation offers the advantages of complete metal removal and low quartz damage. Femtosecond laser ablation requires a special type of optical source. In particular, mode-locked Titanium doped Sapphire (Ti:Sapphire) based lasers are used to produce high intensity femtosecond pulses.

To fix the opposite problem-unintentional absence of metal, one conventional method involves first using a vacuum deposition apparatus to deposit copper on the mask, then using a focused ion beam tool to decompose a gold compound in order to deposit gold in a predetermined pattern, and finally etch removal of the copper. The copper which must be deposited and then removed, adding to the complexity of the process, is necessary to avoid charging of the substrate being repaired, which would deflect the ion beam from the intended pattern. The process requires two separate vacuum processing steps, i.e., for depositing the copper and for depositing the gold, making it very time consuming.

Laser Induced Chemical Vapor Deposition (LICVD) has been used to deposit metal on substrates. In one conventional LICVD method, a substrate is enclosed in the presence of an organometallic compound which includes a metal to be deposited, (e.g., trimethyl-aluminum for depositing Aluminum). A focused laser is then trained on a point of a substrate, at which it is desired to deposit metal. The laser heats a localized area of the substrate surrounding the point, and causes organometallic molecules which contact the area to thermally decompose and deposit metal. If the laser operates at a wavelength at which the mask substrate is transmissive, then heating must be initiated by focusing the laser on pattern material that is already present (unless very high laser power is used). This complicates the process when it is desired to deposit pattern material that is not contiguous with pattern material that is present before the repair is initiated. Further, using known IR lasers which operate at wavelengths absorbed by fused silica is ordinarily unacceptable in as much as the long wavelength precludes producing sub micron mask features.

Conventional LICVD based solely on heating of the substrate suffer from the drawback that as time is allowed to pass while the laser is trained on the point, in order to deposit a sufficient thickness of material over the area, the size of the area which has a sufficient temperature to cause decomposition of the compound grows, which in turn leads to undesired lateral spread of the deposited metal. Semiconductor applications have very low tolerance for dimensional errors, and therefore undesired lateral growth is unacceptable for semiconductor applications.

Another type of conventional LICVD is photolytic in character, in that an organo-metallic molecule is photochemically, as opposed to thermally, decomposed at or near a substrate surface by a laser operating at a wavelength corresponding to a photon energy which exceeds a chemical bond energy of the molecule. One known photolytic process has a linear dependence on laser light intensity. A photolytic process may require a number of separate molecule-photon interactions in order to break a number of bonds in order to release elemental metal for deposition. In these processes, a portion of the photon energy which exceeds a particular molecular bond energy, may initially be converted to vibrational energy of the organometallic molecule, and subsequently be dissipated to surrounding gas molecules as heat. The excess energy therefore, does not contribute to breaking other bonds of the molecule. Therefore there is an inefficiency in the utilization of photon energy in this conventional photolytic LICVD.

In so far as semiconductor applications require tight tolerances to be maintained, in LICVD for semiconductor application, diffraction limited optical systems, including inter alia, expensive aspheric lenses are called for. For conventional LICVD, the optical system may be required to operate in the ultraviolet region of the spectrum, depending on the bond energies of the specific organometallic compound being used. The optical system must then be designed to operate in the ultraviolet which further increases its cost.

What is needed is a method and apparatus for conducting high resolution, selective deposition.

It would be desirable to have a method and apparatus for conducting LICVD that makes more efficient use of photon energy.

SUMMARY OF THE INVENTION

The invention provides a method of depositing one or more elements on a substrate. The method includes the steps of: providing a substrate, providing a donor compound, and irradiating the donor compound with optical radiation having an instantaneous intensity of at least about 5 Gigawafts per square centimeter.

BRIEF DESCRIPTION OF THE FIGURES

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

It should be understood that the embodiments presented are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
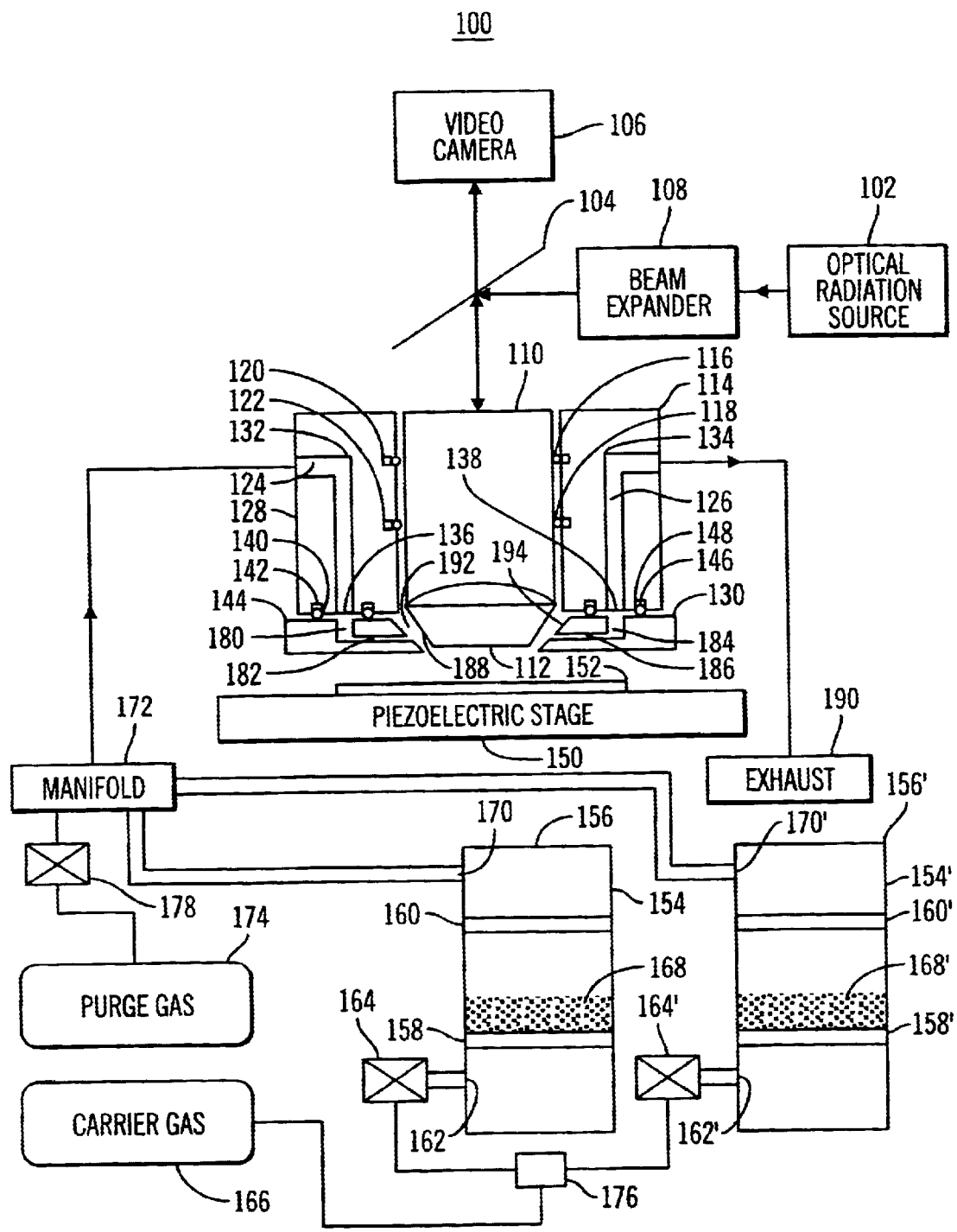
FIG. 1 is a schematic of a LICVD system according to a preferred embodiment of the invention.

FIG. 1 is a schematic of a chemical vapor deposition (CVD) system 100 according to a preferred embodiment of the present invention. As shown, an optical radiation source 102 is provided. The optical radiation source 102 preferably has an output power of at least 0.1 watts, and more preferably at least 1 watt. The optical radiation source 102 preferably produces radiation that it is collimated or radiation that has a wave front (i.e., surface of constant phase) with a distinct curvature, and center, or virtual center (e.g., a guassian beam, as opposed to volume sources such as discharge lamps). This allows optical radiation from the optical radiation source 102 to be efficiently collected and focused preferably to a diffraction limited, as opposed to source size limited spot. Furthermore, the optical radiation source 102 preferably outputs radiation at a sufficiently small wavelength that, the radiation can be focused into a sufficiently small area, to achieve instantaneous intensities of preferably at least about 5 Gigawatts per square centimeter, more preferably at least about 50 Gigawatts per square centimeter. The optical radiation source 102 preferably emits at a wavelength between 10 nanometers (nm) and 4 microns, and more preferably, at a wavelength between 100 nm and 1 micron.

In preferred embodiments, the optical radiation source 102 comprises a mode-locked Titanium doped Sapphire (Ti:Sapphire) laser. The mode-locked Ti:Sapphire laser output is preferably characterized by a pulse time (which may be characterized by a full width half max FWHM value) of at most about 1 picosecond, and more preferably less than 125 femtoseconds. An advantage of using short pulse light is that if the pulse rate is maintained sufficiently low, high intensity light can be obtained without substantial heating. On the other hand, in one embodiment of the present invention, a high pulse rate is used to achieve a combined effect which results from using both very high intensity light and controlled heating.

The optical radiation source 102, is optically coupled to a beam expander 108. The beam expander 108 is useful in widening a beam of optical radiation output by the optical radiation source 102 in order to improve the focusing of the beam by a high power microscope objective 110. The microscope objective serves to direct optical radiation to an intended target in order to obtain high resolution patterning, and serves to concentrate optical radiation in order to achieve very high optical radiation intensity. The optical radiation source 102, the beam expander 108, a filter 104, and the objective 110 are parts of an optical system used to obtain very high instantaneous optical radiation intensities, e.g., preferably at least 5, more preferably at least 50 Gigawatts per square centimeter.

Optical radiation output by the beam expander 108 is reflected from spectrally selectively reflecting mirror 104, to the objective 110. In the preferable case in which the optical radiation source 102 is a laser, the mirror 104 can include a narrow band reflective coating. Optical radiation from the optical radiation source 102 is incident on a first side of the mirror 104 at a non perpendicular (e.g., 45 degree) angle. A video camera 106 faces a second side of the mirror 104. An image thrown by the objective 110 is transmitted through the mirror 104 to the video camera 106. The video camera 106 is used to observe deposition, and determine the condition (laminar or turbulent) of a process gas flow. The objective 110 comprises an object field aperture 112 at the far end.

A cylindrical gas flow jacket 114 is mounted around the objective 110 and mechanically coupled thereto by first and second O-rings 116 and 118. The first and second O-rings are located in first and second internal annular O-ring grooves 120 and 122 which are machined in the gas flow jacket 114. The gas flow jacket 114 comprise a gas inlet conduit 124, and a gas outlet conduit 126. Both conduits 124 and 126 extend from an outer cylindrical wall 128 of the gas flow jacket, inward to respective 90 degree turns 132 and 134, and downward to respective openings 136 and 138 in a lower end face 130.

An orifice plate 144 is clamped to the lower end face 130 of the gas flow jacket 114 by a number of recessed (i.e., counterbored) machine screws (not visible). The screws are oriented parallel to the optical axis of the objective 110. The orifice plate 144 comprises a vertical gas delivery passage 180 connected to a horizontal gas delivery passage 182, and a vertical gas exhaust passage 184 coupled to a horizontal gas exhaust passage 186. Inner openings in the horizontal gas delivery passage 182, and the horizontal gas exhaust passage 186 face a conical collar 188 located at a lower end of the objective 110. A annular gap 192 is defined between the conical collar 188, and an inner surface 194 of the orifice plate, which is also conical in shape. In one exemplary embodiment, the width of the gap between the conical collar 188 and the facing inner surface of the orifice plate 194 is 0.050". In the exemplary embodiment, the horizontal gas delivery passage 182, and the horizontal gas exhaust passage 186 are drilled holes 0.125" (3.175 mm) in diameter. The orifice plate serves to establish a flow of process gas and vapor over a substrate 152.

A third O-ring 140 located in a first external O-ring groove 142 seals between inlet conduit opening 136 and a top opening of the vertical gas delivery passage 180 of the orifice plate 144. A fourth O-ring 146 located in a second external O-ring groove 148 seals between outlet conduit opening 138 and a top opening of the vertical gas exhaust passage 184 of the orifice plate 144.

A piezoelectric stage 150 is located below the object field aperture 112 of the objective 110. The piezoelectric stage 150 has at least one degree of movement which is not parallel to an optical axis of the objective 110, and is preferably orthogonal to the optical axis of the objective 110. More preferably, the piezoelectric stage is capable of moving in two directions which are approximately orthogonal to the optical axis.

The substrate 152 is supported on the piezoelectric stage 150. The distance between the top surface of the substrate 152 and the objective field aperture 112 is chosen so that the top surface of the substrate 152 is coplanar with a focal plane of the objective 110, such that optical radiation output by the optical radiation source 102 will be focused at a point on the top surface of the substrate 152. For the preferable case in which a laser is used as the optical radiation source 102, the distribution of optical radiation about the point is preferably a diffraction limited distribution. Such diffraction limited distributions include a central lobe which can be approximated by a guassian distribution function. The width of such a diffraction limited distribution of optical radiation is approximately equal to $\lambda/2NA$, where $\lambda$ is the wavelength of optical radiation and NA is the numerical aperture of the objective 110 used to focus the optical radiation. The numerical aperture of the lens is preferably at least 0.2, and more preferably at least 0.85. Using a high numerical aperture serves to better focus the optical radiation. The width of the distribution leads (by straight forward calculation) to an approximate area over which the optical radiation is distributed. The joules per pulse of the laser and the pulse time can then be used to calculate an instantaneous intensity value.

As shown a first vapor source 154, comprises a vessel 156 which is partitioned into three spaces by an upper glass frit plate 60 and a lower glass frit plate 158. The glass frit plates 158 and 160 are gas permeable. A solid donor compound or mixture of donor compounds 168 are supported on top of the lower glass frit plate 158. The term donor compound as used in this application means a compound which can be decomposed by optical radiation to yield one or more atoms of one or more elements (e.g., tungsten, chromium, molybdenum, gold, silicon, gallium, aluminum, titanium, platinum, copper, iron, palladium, nickel) which contribute to a deposit on a substrate, e.g. a film being deposited.

A carrier gas bomb 166 is coupled through a first 'T' 176, and a pressure regulating valve 164 to a inlet opening 162 in the vessel 156. Photochemically inert gases such as argon, or helium are preferred for the carrier gas. The input orifice 162 is located below the lower glass frit plate 158. Carrier gas admitted through the input orifice 162 permeates the lower glass frit plate 158, contacts the donor compound(s), and mixes with a vapor of the donor compound(s) 168. The mixture of carrier gas and donor compound vapor passes through the upper glass frit plate 160, and exits the vessel 156 through an exit orifice 170, and is conducted to the inner opening of the horizontal gas delivery passage 182. The mixture then flows between the objective field aperture 112 and the top surface of the substrate 152, and into the horizontal gas exhaust passage 186. The gas is then conducted to a plant exhaust 190. While flowing over the substrate 152, molecules of donor compound will be deposited on the top of the substrate 152. Incidently, molecules of donor compound may also be deposited on other parts of above describe system, without adverse effect.

A second vapor source 154' shares the above describe construction details with the first vapor source 154. Elements of the second vapor source 154' which correspond to elements of the first vapor source 154 share the same reference numerals. Reference numerals applied to the second vapor source are followed by a single quotation mark. The donor compound 168' used in the second vapor source 154' is preferably different from the donor compound 168 used in the first vapor source 156. The carrier gas bomb 166 is coupled to input orifice 162' of the second vapor source 156' through the first 'T' 176, and a second pressure regulating valve 164'.

An exit orifice 170' of the second vapor source 156' is coupled to a second input of a manifold 172. A purge gas bomb 174 is also coupled to the manifold 172 through a third pressure regulating valve 178. Rather than using a separate purge gas bomb 174 and carrier gas bomb 166, a single gas bomb which contains a gas which serves both as the carrier gas, and the purge gas can be coupled through a second 'T' to both the manifold 172, and the first 'T' 176. The manifold 172, includes an output coupled to an entrance orifice 176 of the inlet conduit 124. Providing two vapor sources 156 and 156' allows a multilayer film to be deposited on the substrate 152 without removing from the stage 150.

The vapor pressures of the donor compounds are preferably at least about 1 millitorr, and more preferably at least about 10 millitorr. The vapor pressures of the donor compounds are temperature dependent, as known. The above stated preferable ranges are selected to obtain a sufficiently high rate evaporation of donor compounds, in order to obtain a reasonable rate of delivery of donor compounds to the substrate 152.

According to a first embodiment of the invention, the temperatures of the donor compounds 168 and 168' in the first and second vapor sources 154 and 154' are preferably substantially equal to the average temperature of the substrate 152. Under such conditions, the flow of carrier gas causes a film of up to a few monolayers in depth to be formed on interior surfaces of the vapor sources 154 and 154' and parts of the system downstream from them, including importantly the substrate 152. It is believed that from one to about 5 monolayers form on the substrate 152. Preferably there are less than 50 monolayers on the substrate, more preferably less than 5. Having too thick a layer of donor compound on the substrate 152 can degrade adhesion of a deposit formed from the donor compound. A heater or cooler could be provided for first vapor source 154, second vapor source 154, and/or substrate. More preferably, the donor compounds 168 and 168' and the substrate 152 are at room temperature. According to an alternative embodiment of the present invention the substrate 152 is subject to localized heating at a laser focus.

Some donor compounds which have been used by the inventors in practicing the invention are: Chromium hexacarbonyl which has a vapor pressure of 200–300 millitorr at room temperature, Molybdenum hexacarbonyl which has a vapor pressure of 100–200 millitorr at room temperature, Tungsten hexacarbonyl which has a vapor pressure or 20–100 millitorr at room temperature, and dimethylgold-trifluoro acetylacetonate which has a vapor pressure of approximately 100 millitorr at 25 C. Uncertainties of vapor pressure are due to the error bars of values reported in scientific literature. Other donor compounds which may be useful in practicing the invention include but are not limited to: aluminum hexafluouracetylacetonate, and platinum (II) hexafluouroacetylacetonate.

Figure 2:
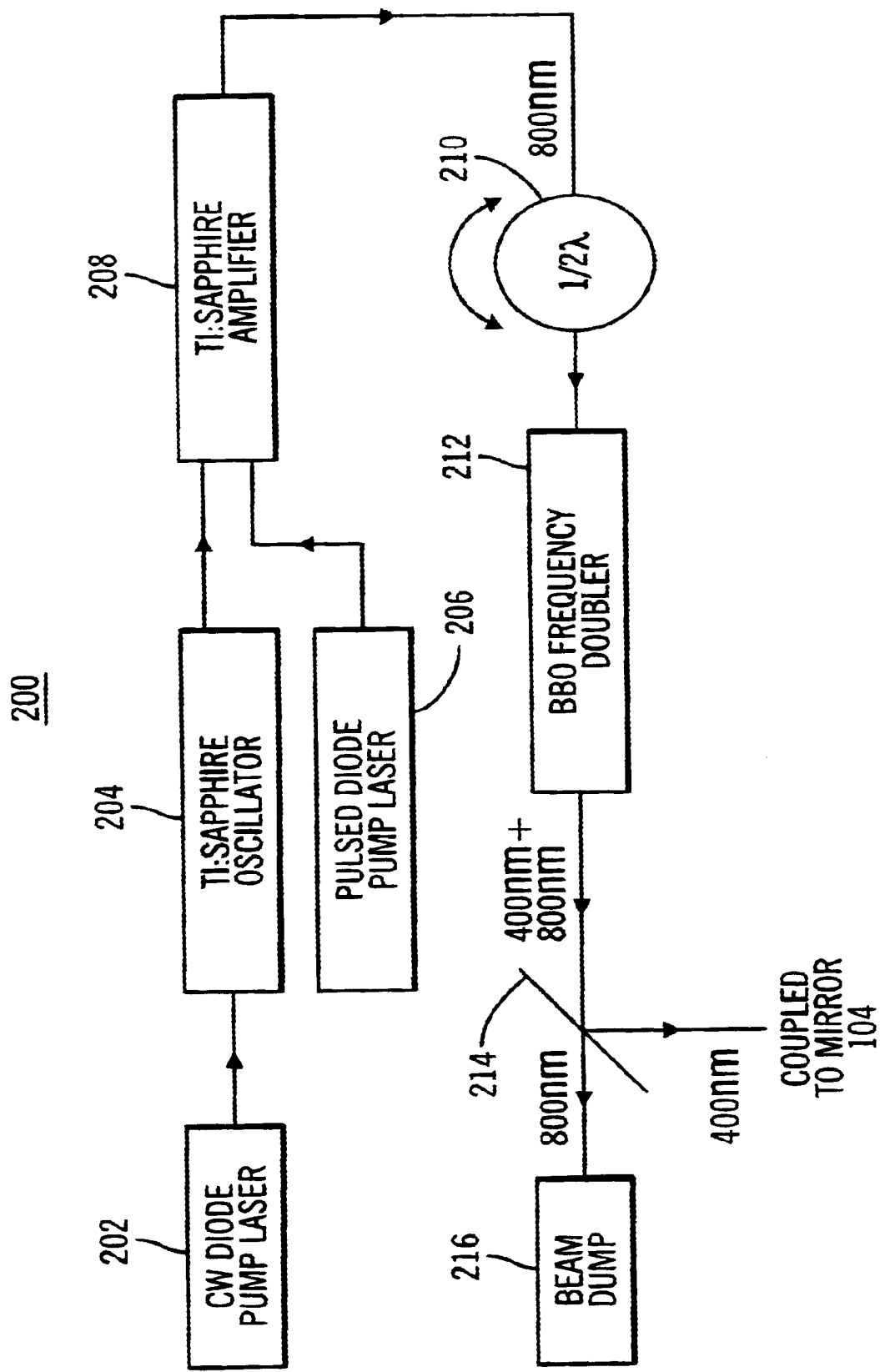
FIG. 2 is a block diagram of a laser based optical radiation source used in the preferred embodiment of the present invention.

FIG. 2 is a block diagram of a laser based optical radiation source 200 according to a preferred embodiment of the present invention. The optical radiation source 200 comprises a CW diode pump laser 202 optically coupled to a mode-locked Ti:Sapphire oscillator 204. Outputs of the Ti:Sapphire oscillator 204 and a pulsed diode pump laser 206 are optically coupled to a Ti:Sapphire amplifier 208 which outputs 100 femtosecond, 800 nm optical radiation pulses, at a rate of eighty million pulses per second (80 MHz). The Ti:Sapphire amplifier 208 is optically coupled through a rotatable quartz one-half wave plate 210 to a Beta Barium Borate frequency doubler crystal 212. The one-half wave plate 210 is used to control the polarization of optical radiation coupled into the frequency doubler crystal 212, and thereby control the intensity of optical radiation output by the frequency doubler crystal 212. The frequency doubler crystal 212 receives optical radiation from the Ti:Sapphire laser at 800 nm, and converts a portion of the optical radiation to 400 nm optical radiation. Optical radiation output by the frequency doubler crystal 212 is reflected by a spectrally selective mirror 214, which reflects 400 nanometer radiation, and allows 800 nanometer radiation to be transmitted to a beam dump 216. Four hundred nanometer optical radiation reflected by mirror 214 is optically coupled to mirror 104. For use in combination with the optical radiation source 200, the mirror 104 is designed to reflect 400 nm optical radiation. A 160×0.95 numerical aperture (NA) objective manufactured by Leica of Wezlar, Germany was used as objective 110 in combination with the optical radiation source 200, in experiments carried out by the inventors. This objective is capable of focusing the optical radiation to a diffraction limited spot of 300 nm in diameter. The one-half wave plate 206 is preferably adjusted so that the frequency doubler crystal 204, outputs optical radiation pulses of between 10 picojoules and 2 nanojoules, and more preferably between 100 picojoules and 2 joules, so as to obtain optical radiation impinging donor compounds at the substrate 152 surface which preferably has an instantaneous intensity of above 5 Gigawafts per square centimeter and more preferably above 50 Gigawatts per square centimeter and even more preferably between 50 Gigawatts and one Terawaft per square centimeter. Exceeding one Terawatt per square centimeter may result in ablation and/or poor quality deposit.

A Tsunami model laser, manufactured by Spectra Physics of Mountain View, Calif. was used as the oscillator 204, a Millenia model laser, manufactured by Spectra Physics was used as the CW diode pump laser 202, a Spitfire model laser manufactured by Spectra Physics was used as the Ti:Sapphire amplifier 208, and an Evolution model laser manufactured by Spectra Physics was used the pulsed diode pump laser 206. The Spitfire Ti:Sapphire amplifier 208 is capable of outputting 10 nanojoule 100 femtosecond pulses. This amount of energy per pulse is more than is required for practicing the invention, and in fact may be high enough to cause undesired substrate damage and or ablation of deposited material. By controlling the polarization of optical radiation using the one-half wave plate 210, the amplitude of 400 nm optical radiation output by the frequency doubler 212 can be controlled.

Optical components used for 400 nm optical radiation are less expensive and have a higher longevity than deep UV optical components. The upper wavelength of deep UV is generally regarded as 350 nm. It is advantageous to use an optical radiation source which produces optical radiation above the deep UV in order to allow the use of non deep UV optical components. The resolution which can be obtained using wavelengths above the deep UV (e.g., 400 nm) is sufficient for repairing 4×reduction lithography masks for 0.1 micron lithography. On the other hand, for applications that require higher resolution, it would be advantageous to use a deep UV optical radiation source.

The optical radiation source shown in FIG. 2 can also be used in the ablater taught in U.S. Pat. No. 6,090,507. Therefore there is the possibility of using the present invention in combination with the teachings of the '507 patent to make a combined ablating/deposition tool for use in lithography mask repair, which use the same laser for both purposes.

Figure 3:
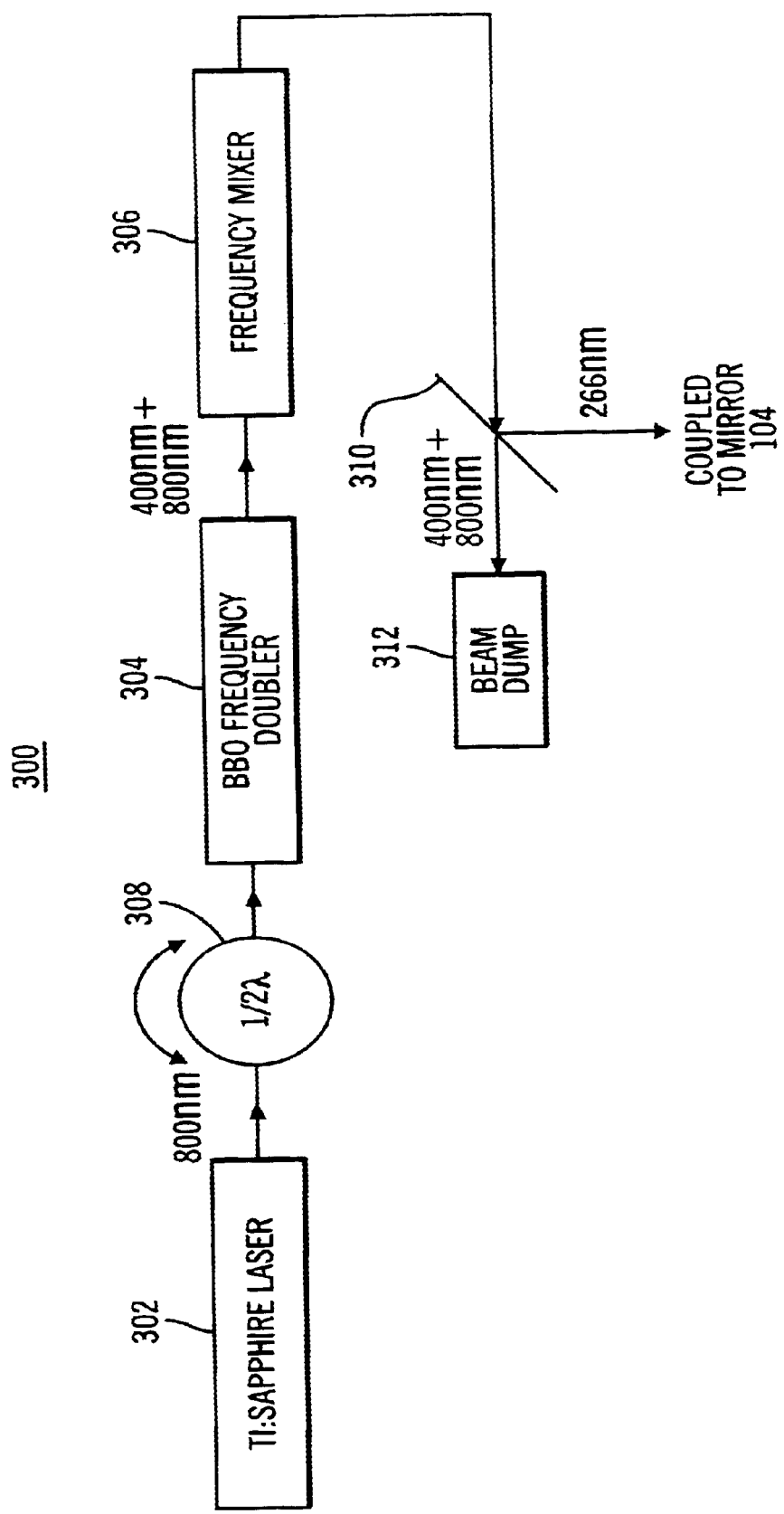
FIG. 3 is a block diagram of a laser based optical radiation source used in an alternative embodiment of the present invention.

FIG. 3 is a block diagram of a laser based optical radiation source 300 according to an alternative embodiment of the present invention. The optical radiation source 300 comprises a mode-locked Ti:Sapphire laser/ amplifier 302 which outputs 1 millijoule, 800 nm, 100 femtosecond pulses at a rate of one thousand pulses per second (1 KHz). The Ti:Sapphire laser 302 is optically coupled through a rotatable quartz on-half wave plate 308 to a Beta Barium Borate frequency doubler crystal 304. The Barium Borate frequency doubler crystal 304 is optically coupled to a Beta Barium Borate frequency mixer crystal 306. The frequency mixer crystal mixes 400 nm and 800 nm optical radiation which is coupled to it from the frequency doubler crystal 304, and outputs 266 nm, and residual 400 nm and 800 nm optical radiation. The output of the frequency mixer crystal 306 is coupled to the mirror 104. For use in combination with the optical radiation source 300 shown in FIG. 3, the mirror 104 can be designed to reflect 266 nm optical radiation. A 100×0.9 NA objective manufactured by Carl Zeiss of Jena, Germany was used as objective 110 in combination with the optical radiation source 300 shown in FIG. 3. The latter objective is capable of focusing the optical radiation to a diffraction limited spot of 200 nm diameter, which is calculated to have a peak instantaneous intensity of 100 Gigawatts per square centimeter.

The optical radiation source 102 (shown in specific embodiments 200, and 300) is preferably capable of generating optical radiation, which when focused (if necessary) has an instantaneous intensity sufficient for nonlinear interaction with the donor compound.

Methods of operation of the CVD system 100, using the optical radiation source 200 shown in FIG. 2 will now be described. According to a first method, a fused silica substrate 152 is positioned on the stage 150. One of the valves 164 or 164' is opened to start a flow of carrier gas. This results in a mixture of donor compound vapor and carrier gas flowing between the substrate 152 and the objective field aperture 112. The valve 164 or 164' is adjusted in order to obtain a laminar (as opposed to turbulent) flow over the substrate 152. Turbulent flow results in a blurry image of the substrate as viewed by the video camera 106. In response to observing the turbulent flow, the valve can be adjusted to reduce the flow rate of the carrier gas until the flow becomes laminar. With the orifice plate 144 described above, adjusting the valve 178 to obtain a pressure of approximately 10 PSI resulted in laminar flow. The flow of gas over the substrate 152 results in a few monolayer thick film of donor molecules being maintained on the substrate 152. A film of a few monolayers of donor molecules, can be expected to have an exceedingly weak single photon absorption cross-section for 400 nanometer radiation.

When the high intensity optical radiation source 200 shown in FIG. 2 is used to irradiate the donor compound on the substrate it is found that conversion of the donor compound film to a film of the element(s) born by the donor compound (e.g., tungsten, Chromium, or Gold) is in fact initiated. Once the element(s) born by the donor compound starts to deposit, if, as is most likely the case, its absorption cross-section at 400 nm is higher than that of the fused silica substrate, then the deposited elements absorb optical radiation which will heat the substrate in the vicinity of the focus of the optical radiation. Then thermal decomposition of the donor compound becomes significant in effecting the rate of further deposition. In order to cause thermal decomposition to further promote deposition, the optical radiation source 200 preferably has an average power output of at least 300 microwatts, and more preferably an average power output of at least one milliwatt. Furthermore the power of optical radiation source 200 is preferably focused to achieve an average power density of at least about 380 Kilowatts per square centimeter, more preferably at least about 1250 Kilowatts per square centimeter. Deposition is believed to start at a central portion of the central lobe of the diffraction limited focus, and grow laterally. Therefore by a judicious (sufficiently high) choice of scan rate it is possible to deposit lines having widths less than the width of the central lobe.

Thus, according to one aspect of the present invention, an optical radiation source which produces photons at a wavelength at which the donor compound has insufficient cross section to yield significant decomposition in conventional processes is operated at a sufficient instantaneous intensity to initiate decomposition of the donor composition (e.g., by a nonlinear two photon absorption process).

According to another aspect of the present invention, an optical radiation source which produces photons which have energy quanta insufficient to cause decomposition of donor compound is operated at a sufficient instantaneous intensity to initiate decomposition of the donor composition (e.g., by a nonlinear two photon absorption process).

According to yet another aspect of the present invention, deposition is started at the surface of the substrate 152, in a focus of the optical radiation source 200, by a nonlinear absorption process which results in an initial decomposition of a donor compound resulting in a deposited element(s) from the donor compound. Thereafter, optical radiation is absorbed by the deposited elements at the focus so as to cause local heating, which in turn leads to further breakdown of donor compound by pyrolysis. For some embodiments of the present invention, the absorption cross-section of donor molecule, (which is ordinarily reported in the scientific literature based on measurements conducted in the gas phase) at one or more wavelengths generated by the optical radiation source is preferably sufficiently small to avoid significant photolytic break down of donor molecules in the carrier gas above the substrate. It is preferred to have the breakdown of donor molecules occur on the substrate. The latter leads to better control over the area of the deposit, and to higher quality film. The decomposition process cross-section of donor compounds at the wavelength(s) included in the optical radiation used is preferably less than, $1\times10^{-20}cm^2$, more preferably less than $1\times10^{-21}cm^2$. It is preferable to use optical radiation that has an instantaneous intensity of at least 5 Gigawatts per square centimeter, and more preferably at least 50 Gigawatts per square centimeter in combination with donor compounds that have a cross-section of less than $1\times10^{-20}cm^2$ at the wavelength(s) of the optical radiation, in order to obtain a sufficient rate of donor compound breakdown on the substrate 152, while limiting donor compound breakdown above the substrate 152. It is more preferable for the same reason to use optical radiation that has an instantaneous intensity of a least 5 Gigawatts per square centimeter, and more preferably at least 50 Gigawatts per square centimeter, in combination with donor compounds that have a cross-section of less than $1\times10^{-21}cm^2$ at the wavelength(s) of the optical radiation. Chromium hexacarbonyl, Tungsten hexacarbonyl, and Molybdenum hexacarbonyl are believed to have cross-section of less than $1\times10^{-21}cm^2$ at 400 nm.

EXAMPLE 1

Figure 4:
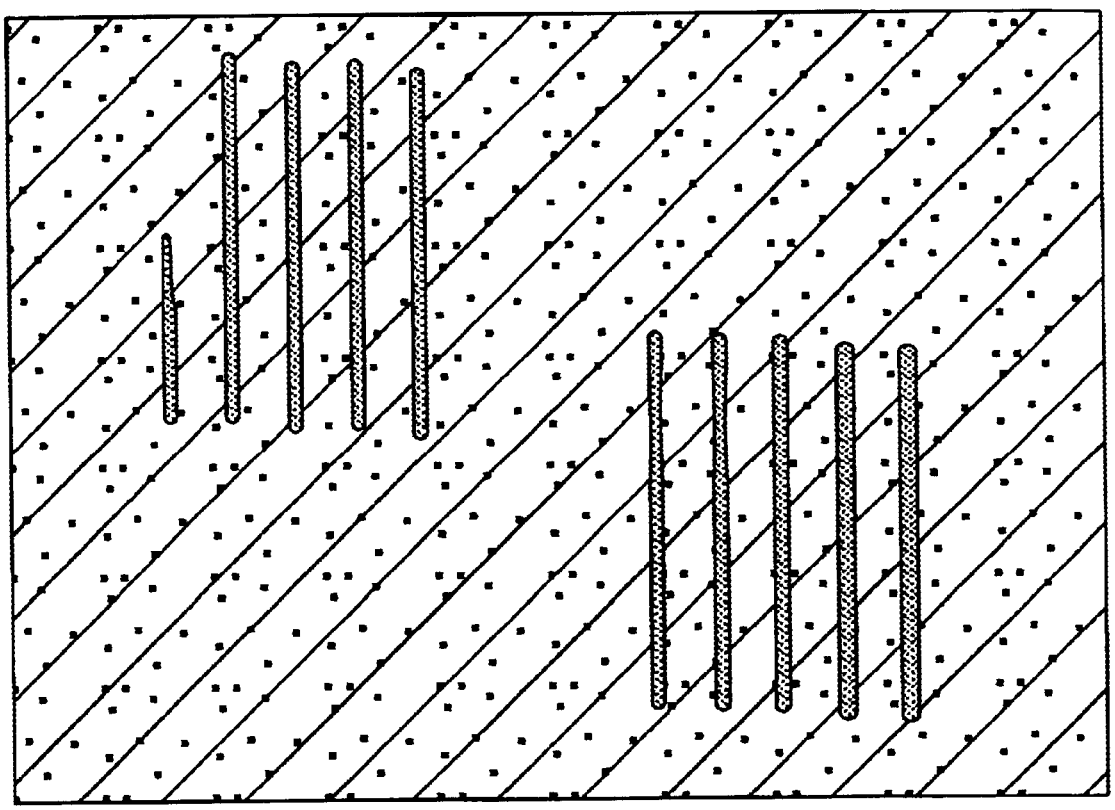
FIG. 4 is an image of a set of lines of Molybdenum deposited on a fused silica substrate.

FIG. 4 shows an image of Molybdenum lines deposited on a fused silica substrate, using the CVD apparatus 100 shown in FIG. 1 with the optical radiation source 300 shown in FIG. 3. In the upper left group, the lines are 0.5 microns wide End separated by 3 microns. The four long lines are 20 microns long. In the lower right group the liners are 20 microns long, and 1 micron wide. In order to produce the lines, a Molybdenum hexacarbonyl donor compound was used. The pressure going into the gas flowjacket 114 was set at approximately 10 PSI. The flow of carrier gas mixed with donor compound vapor was observed through the video camera 106 to be laminar. The laser was operated to produce 100 femtosecond, 20 picojoule pulses at a rate of one thousand pulses per second. The piezoelectric stage 150 was scanned at a rate of two microns per second. The width of the lines deposited can be controlled by controlling the scan rate of the piezoelectric stage 150. The image shown in FIG. 4 was taken with a 250 nanometer microscope after brushing with soap and water.

EXAMPLE 2

Figure 5:
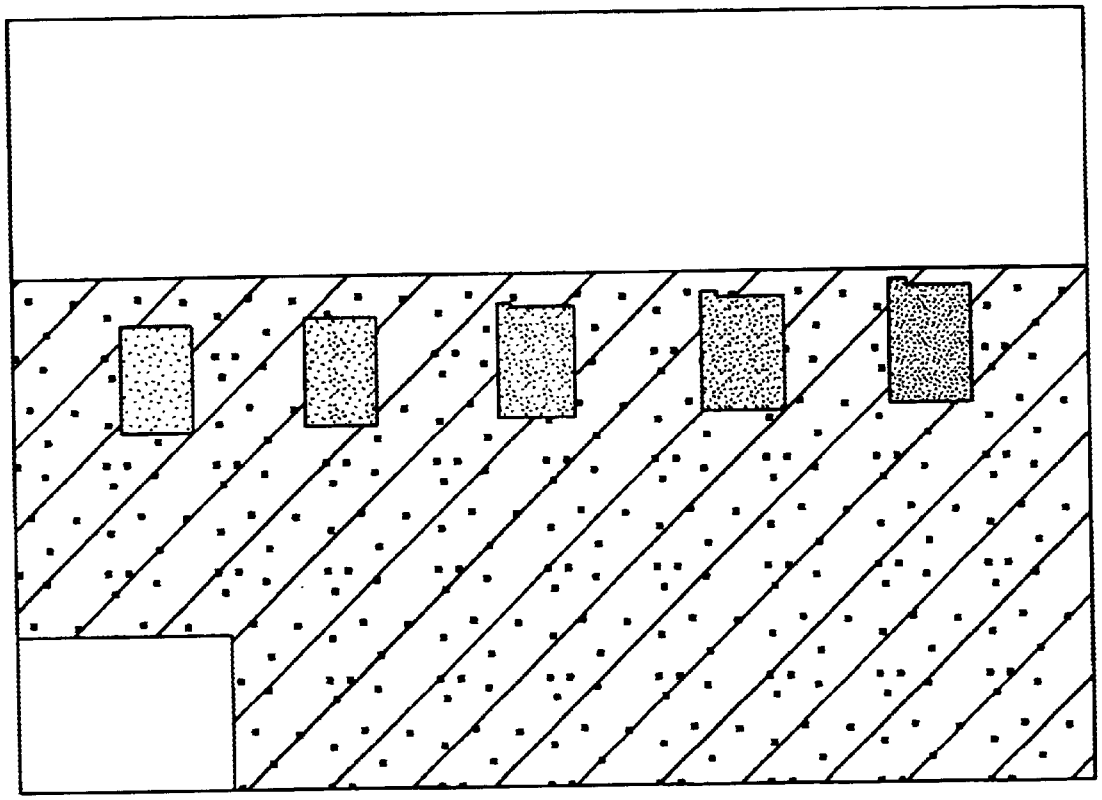
FIG. 5 is an image Molybdenum patches deposited on a fused silica substrate.

The same apparatus and procedure used to deposit lines shown in FIG. 4 was also used to deposit a series of patches as shown in FIG. 5. These patches were produced by raster scanning over a series of six by ten micron rectangular areas. In performing the raster scan to deposit the patches shown in FIG. 5, the stage was moved vertically in increments of 0.1 microns at a rate of 10 increments per second. Between each vertical traverse of the area, the stage 152 was moved horizontally by 0.3 microns. The patches shown in FIG. 5, preceding from left to right correspond to 3, 4, 5, 6 and 8 repetitions of raster scanning over the same area. As is apparent from the FIG. the optical density of the patches increases as the number of repetitions over the same area increases. Optical density is an important property of metal deposits used for a photolithography mask.

The optical radiation source 300, operates at 266 nm so that the single photon energy is sufficient to break chemical bonds in many useful donor compounds such as chromium hexacarbonyl, and tungsten hexacarbonyl. In accordance with the teaching of the invention, the optical radiation source 300 produces radiation at an instantaneous intensity sufficient to obtain enhanced donor compound decomposition. One mechanism for the enhancement, is the supplying of photons at such a high rate that excess energy from a first photon's bond breaking interaction with a donor molecule is not dissipated to a surrounding environment (e.g., substrate, other donor molecules) before a second photon interacts with the donor molecule. The excess energy which can for example take the form of vibrational energy is believed to render the donor molecule more susceptible to complete breakdown by the second photon.

EXAMPLE 3

Figure 6:
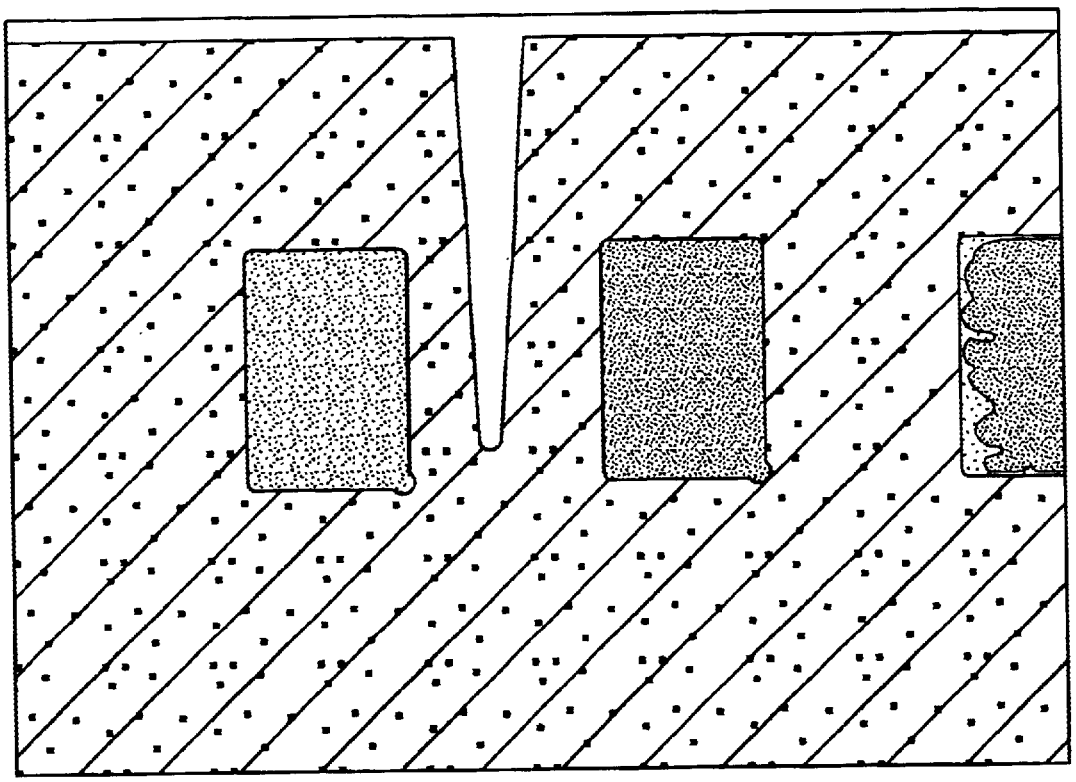
FIG. 6 is an image of patches including superposed lamina of Chromium and Gold deposited according to one embodiment of the present invention.

FIG. 6 shows two six by ten micron patches deposited on a fused silica substrate. The left and center patch consists of a layer of Gold superposed on a layer of Chromium. The right patch (which is partially truncated in FIG. 6) consists of a layer Chromium. FIG. 6 was taken prior to an acid cleaning operation. Optical radiation source 200 shown in FIG. 2 was used to produce the patches shown in FIG. 6. The optical radiation source produced 100 femtosecond laser pulses at a rate of 80 million pulses per second. The average power used for depositing Chromium was 0.8 milliwatts, 0.56 milliwatts, and 0.88 milliwatts at the surface of the photomask, for the left, center, and right patches respectively. Chromium hexacarbonyl was used in the first vapor source 154 for depositing Chromium. The stage 150 was raster scanned at a rate of 4 microns per second to cover a 6 micron by 10 micron patch of a fused silica substrate. The pitch between successive scan lines was 0.3 microns. The left and center patches appear to be optically dense.

The gas flow jacket 114, and orifice plate 144 were then purged. Subsequently dimethylgold-trifluoro acetylacetonate was used in the second vapor source 154' for depositing. The optical radiation source was operated at an average output powers of 10 milliwatts, and for both the left and center patches. Gold was not deposited on the right patch. The stage was raster scanned as before.

The patch shown in FIG. 6 was cleaned with 80 C nitric acid in order to test the adhesion of the patch to the glass substrate.

Figure 7:
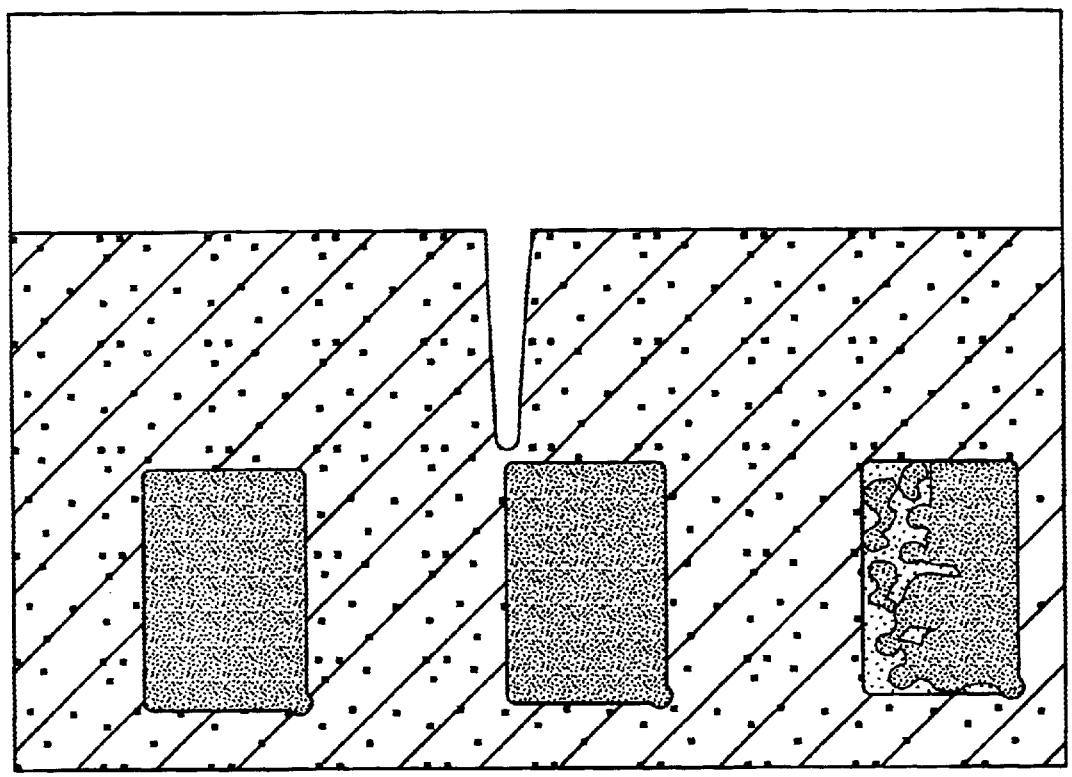
FIG. 7 is an image of the patch shown in FIG. 6 after acid cleaning.

FIG. 7 is an image of the patch shown in FIG. 6 after cleaning. As shown in FIG. 7, no delamination or corrosion of the patch occurred. The left and center patches remain optically dense.

EXAMPLE 4

Figure 8:
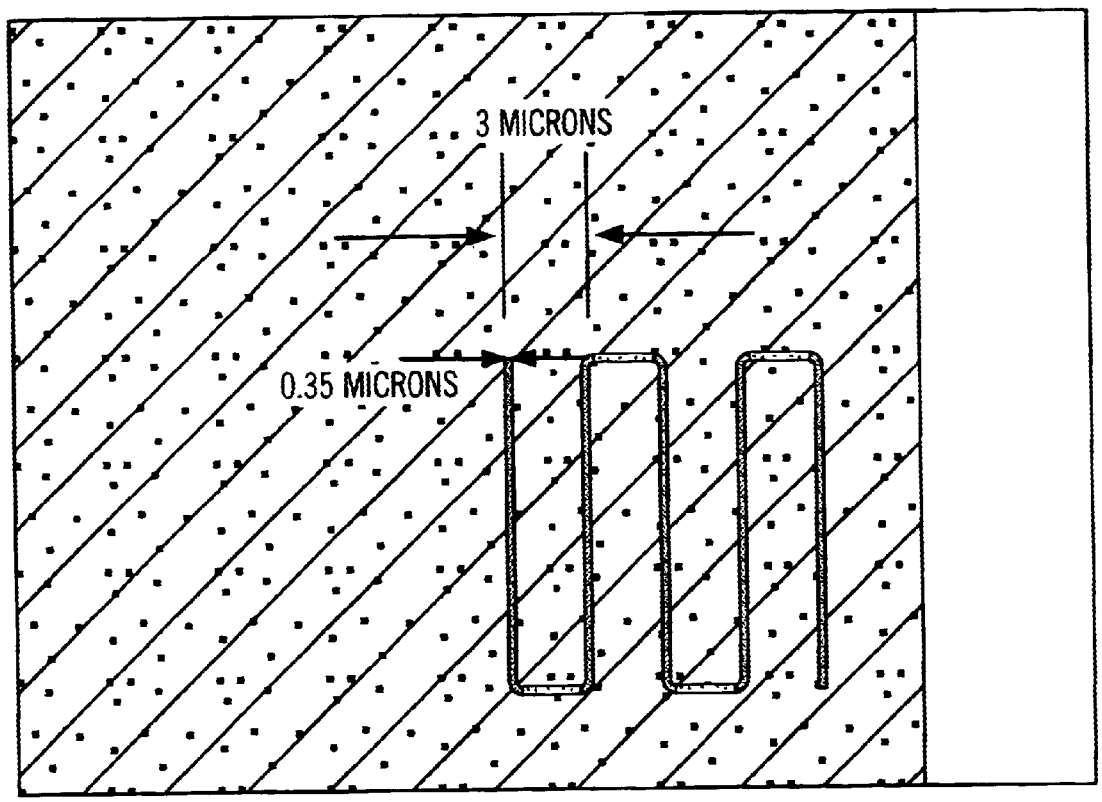
FIG. 8 is an image of a sub wavelength width serpentine line of chromium deposited on a fused silica substrate.

FIG. 8 shows an image of a serpentine chromium line deposited on a fused silica substrate using the deposition apparatus 100 shown in FIG. 1 and optical radiation source 200 shown in FIG. 2. The line is 0.35 microns wide. In order to produce the lines Chromium hexacarbonyl was used as the donor compound. The pressure of gas into the flow jacket 114 was set at approximately 10 PSI. The flow of carrier gas mixed with donor compound vapor was observed through the video camera 106 to be laminar. The laser was operated to produce 100 femtosecond, 60 picojoule pulses at a rate of 80 million pulses per second. The piezoelectric stage 150 was scanned at a rate of 150 microns per second. The width of the lines deposited corresponds to the width of the diffraction limited distribution of optical radiation at the focus.

The optical system used to achieve very high intensities is not limited to using the laser system shown in FIGS. 2 or 3 in combination with an objective lens 114. Other presently known systems, or systems developed in the future can also be used.

In preferred embodiments of the invention, by concentrating the power of the optical radiation source within very short pulses the percentage of photons which are absorbed by a few monolayer high film of donor compounds, and the percentage of photons which contribute to donor compound break down, (and thereby contribute to deposition) is increased. In other words, if the same energy that is contained in the femtosecond pulses according to the teachings of the invention were to be spread out over nanosecond pulses, or averaged Ever a CW beam, such as used in conventional LICVD, the percentage of photons absorbed by donor compound molecules would be substantially reduced. To compensate, the average power of the laser would need to be increased. The latter would lead to increased heating of the substrate and uncontrolled lateral spread of the deposit.

In preferred embodiments, the optical radiation source 102, (shown in specific embodiments 200 and 300) is capable of generating optical radiation, which when focused (if necessary) has an intensity sufficient for nonlinear optical interaction with the donor compound.

In one embodiment using optical radiation source 300, 260 nm light pulses arrive at the sample at a repetition rate of 1 kHz, a laminar flow of gas deposits a physisorbed layer of organometallic donor molecules onto the substrate. Above the substrate there is an atmosphere comprising carrier gas saturated with an organometallic donor compound. The 260 nm light pulses are preferably sufficiently short, i.e., preferably less than one picosecond, and more preferably less than 125 femtoseconds, in order to efficiently decompose the organometallic compound into the desired metal film without generating unwanted thermal effects. In further embodiments, the donor compound is irradiated with optical radiation having a wavelength between 200 and 300 nanometers, and preferably between 240 and 280 nanometers.

Short pulses allow the possibility of multiphoton decomposition giving rise to efficient production of metal and such short pulses are believed to be sufficient to decompose all of the molecules on the surface within the focused light beam spot. Such femtosecond pulses allow for decomposition of the molecules physisorbed at the substrate 152 surface before excitation in the molecule can dissipate through energy flow into the substrate. Pulse intensities of at least 5 Gigawatts/cm$^2$ are preferred. If energies fall substantially below this value, deposition does not occur. At higher intensities, deposited metal is reablated creating undesirable debris. Pulse intensities are preferably less than a Terawatt. This process can operate at atmospheric pressure and therefore does not require a vacuum system.

The gas flow over the substrate provides replenishment of organometallic at the substrate surface at a high rate for rapid deposition of metal and also helps to remove products of the decomposition which occurs above, as opposed to on, the surface of the substrate. It is preferable to rapidly remove metal liberated from donor compound in the vapor above the substrate, because otherwise, the metal can deposit on the substrate at a position other than that intended (i.e., lead to non predetermined lateral growth of the deposit.). Preferably the flow velocity over the substrate is at least 5 cm/sec, more preferably, at least 50 cm/sec. Since there is little thermal component present in the process, lateral diffusion of the deposit is minimized and deposits can be made directly on a nonabsorbing substrate such as fused silica or glass.

In another embodiment, using optical radiation source 200, a high (80 megahertz) repetition rate laser producing 100 femtosecond pulses at 800 nm is used as the source laser. The 800 nm light is frequency doubled to 400 nm. The resulting 400 nm light pulses are then directed into the system 100. The single photon absorption cross-section at 400 nm in the metal hexacarbonyl molecules is extremely small, e.g. less than $1\times10^{-20}$ cm$^2$ and does not lead to organometallic decomposition at low light intensities. The short pulsed, high intensity nature of the 100 femtosecond light pulses in this embodiment initiates a nonlinear process occurring in the physisorbed molecular layer residing atop the fused silica substrate and not in the gas phase region above the substrate 152. This nonlinear absorption initiates the decomposition of the organometallic, forming a "seed" deposit of metal which absorbs subsequent pulses of light.

Continuous metal deposition follows from a thermally driven decomposition and deposition.

The short decomposition pulse prevents substantial energy flow from the excited molecule into the substrate. The substrate can be scanned at an appropriate rate to achieve line widths which are comparable in spatial extent to the diffraction limited light spot. Average Intensities of light required to achieve this unique deposition condition are no less than 380 Kilowatts/cm$^2$ (CW), but preferably greater than 1250 Kilowatts/cm$^2$ with an instantaneous intensity of preferably at least 5 gigawatts/cm$^2$ and more preferably at least about 50 gigawatts/cm$^2$. Substantially lower pulse energies result in little or no deposition, while substantially higher pulse energies result in spatially broadened metal deposit features followed by ablation and debris production. Gas flow specifications are similar to that of the previous embodiment and deposition occurs successfully on a non-absorbing substrate such as fused silica and glass.

What is claimed is:

1. A method of depositing one or more elements on a substrate, the method comprising the steps of:

providing a donor compound suspended in a carrier gas, the donor compound including the one or more elements for deposition;

passing the carrier gas with the suspended donor compound over the substrate so as to form a film of the donor compound on the substrate; and irradiating the donor compound with optical radiation having an intensity sufficient to cause deposition of the one or more elements onto the substrate through photochemical decomposition of molecules of the donor compound within the film formed on the substrate, wherein the intensity of the optical radiation is insufficient to cause significant photolytic breakdown of molecules of the donor compound that are suspended in the carrier gas, and wherein the optical radiation has a pulse width that does not cause thermal absorption by the element so as to prevent thermally induced breakdown of the donor compound.

2. The method of claim 1 wherein the step of providing a donor compound comprises providing the donor compound at a temperature substantially equal to an average temperature of the substrate.

3. The method of claim 1 wherein the film formed on the substrate is less than 50 monolayers thick.

4. The method of claim 1 wherein the film formed on the substrate is less than 5 monolayers thick.

5. The method of claim 1 wherein the donor compound comprises of chromium hexacarbonyl.

6. The method of claim 1 wherein the donor compound consists essentially of chromium hexacarbonyl.

7. The method of claim 1 wherein the donor compound comprises dimethylgold-trifluoro acetylacetonate.

8. The method of claim 1 wherein the optical radiation has a wavelength greater than 350 nanometers.

9. The method of claim 1 wherein:

the optical radiation has a peak intensity of at least about 50 Gigawatts per square centimeter.

10. The method of claim 9 wherein the step of providing a donor compound comprises the sub-step of:

flowing a carrier gas in contact with a solid donor compound to generate a mixture of donor compound vapor and carrier gas; and flowing the mixture of over the substrate.

11. The method of claim 9 wherein the donor compound consists essentially of:

dimethylgold-trifluoro acetylacetonate.

12. The method of claim 9 where in the donor compound comprises one or more compounds selected from a group consisting of tungsten hexacarbonyl, molybdenum hexacarbonyl, aluminum hexafluoroacetylacetonate, and platinum (ii) hexafluoroacetylacetonate.

13. The method of claim 1 wherein the step of providing a donor compound comprises the sub-step of:

flowing a carrier gas in contact with a solid donor compound to generate a mixture of donor compound vapor and carrier gas; and flowing the mixture over the substrate.

14. The method of claim 13 wherein the sub-step of flowing the mixture comprises the sub-step of:

flowing the mixture over the substrate at a velocity of at least about 5 cm/second.

15. The method of claim 13 wherein the sub-step of flowing the mixture comprises the sub-step of:

flowing the mixture over the substrate at a velocity of at least about 50 cm/second.

16. The method of claim 1 wherein the optical radiation has a wavelength between 200 and 300 nanometers.

17. The method according to claim 1 wherein the pulse width has a duration of less than 125 femtoseconds.

18. The method according to claim 1, wherein the pulse width has a duration of less than 1 picosecond.

19. The method of claim 1, wherein in the passing step, the carrier gas is passed over the substrate at a rate that causes it to have a laminar flow over the substrate.

20. The method of claim 1, wherein in the passing step, the carrier gas is passed over the substrate at a rate that causes formation of the film of the donor compound on the substrate that is a few monolayers thick.

21. The method of claim 1, wherein the optical radiation has a peak intensity of at least about 5 Gigawatts per square centimeter.

22. The method of claim 1, wherein the step of irradiating includes the sub-step of using a laser source to generate radiation with a wavelength of 400 nanometers.

23. The method of claim 1, wherein the step of irradiating is performed for a duration that is not long enough to cause thermally induced decomposition of the donor compound.

24. The method of claim 1, wherein the intensity is sufficient to initiate decomposition of the donor compound by a nonlinear two photon absorption process.

25. A method of depositing one or more elements on a substrate, the method comprising the steps of:

providing a donor compound suspended in a carrier gas, the donor compound including the one or more elements for deposition;

passing the carrier gas with the suspended donor compound over the substrate so as to form a film of the donor compound on the substrate; and irradiating the donor compound with optical radiation having an intensity sufficient to cause deposition of the one or more elements onto the substrate through photochemical decomposition of molecules of the donor compound within the film formed on the substrate, wherein the intensity of the optical radiation is insufficient to cause significant photolytic breakdown of molecules of the donor compound that are suspended in the carrier gas, and the donor compound has a single photon absorption cross-section of less than $1\times10^{-20}$ cm$^2$ with respect to the optical radiation.

26. The method of claim 25 wherein the donor compound has a single photon absorption cross-section of less than $1\times10^{-21}$ cm$^2$ with respect to the optical radiation.

27. The method of claim 25 wherein the optical radiation has an average power density of at least about 380 kilowatts per square centimeter.

28. The method of claim 25 wherein the optical radiation has an average power density of at least about 1250 kilowatts per square centimeter.

* * * * *